(12) United States Patent
Cho (10) Patent No.: US 12,249,696 B2
(45) Date of Patent: Mar. 11, 2025

(54) BATTERY PROTECTION APPARATUS AND BATTERY SYSTEM INCLUDING THE SAME

(71) Applicant: Samsung SDI Co., Ltd., Yongin-si (KR)

(72) Inventor: Kyusung Cho, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 163 days.

(21) Appl. No.: 17/447,753

(22) Filed: Sep. 15, 2021

(65) Prior Publication Data

US 2022/0093984 A1 Mar. 24, 2022

(30) Foreign Application Priority Data

Sep. 22, 2020 (KR) .................. 10-2020-0122486

(51) Int. Cl.
| | |
|---|---|
| *H01M 10/48* | (2006.01) |
| *B60L 3/04* | (2006.01) |
| *G01R 31/3842* | (2019.01) |
| *H01H 39/00* | (2006.01) |
| *H01M 10/42* | (2006.01) |
| *H02J 7/00* | (2006.01) |

(52) U.S. Cl.
CPC ............ *H01M 10/482* (2013.01); *B60L 3/04* (2013.01); *G01R 31/3842* (2019.01); *H01H 39/00* (2013.01); *H01M 10/425* (2013.01); *H02J 7/00304* (2020.01); *H01M 2010/4271* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 2007/0159138 A1 | 7/2007 | Furuuchi et al. | |
| 2010/0225258 A1* | 9/2010 | Namuduri | B60L 58/20 180/65.285 |
| 2012/0058382 A1 | 3/2012 | Carignan et al. | |
| 2014/0266563 A1* | 9/2014 | Moody | H01H 85/042 337/162 |
| 2018/0277325 A1 | 9/2018 | De Palma et al. | |
| 2019/0092173 A1* | 3/2019 | Waag | B60L 58/10 |
| 2019/0123542 A1* | 4/2019 | Kambham | G01R 31/007 |

(Continued)

FOREIGN PATENT DOCUMENTS

| | | |
|---|---|---|
| CN | 110994706 A | 4/2020 |
| DE | 102012214835 A1 | 2/2014 |

(Continued)

OTHER PUBLICATIONS

DE102017214302A1, English translation (Year: 2017).*

(Continued)

*Primary Examiner* — Haroon S. Sheikh
*Assistant Examiner* — Claire A Rutiser
(74) *Attorney, Agent, or Firm* — Womble Bond Dickinson (US) LLP (57) ABSTRACT

A battery protection apparatus including: a fuse element on a current path between a battery module and an external load to block the current path; and an ignition switch configured to receive an operating voltage from the battery module or a capacitor charged by the battery module, to ignite the fuse element.

17 Claims, 10 Drawing Sheets

(56) References Cited

U.S. PATENT DOCUMENTS

| | | | |
|---|---|---|---|
| 2020/0114781 A1* | 4/2020 | Douglass | B60L 3/04 |
| 2020/0198567 A1* | 6/2020 | Juhl | B60L 1/00 |
| 2020/0223315 A1* | 7/2020 | Binder | B60L 3/04 |
| 2021/0231707 A1* | 7/2021 | Ock | H01M 10/44 |
| 2021/0367440 A1 | 11/2021 | Han et al. | |
| 2021/0391136 A1* | 12/2021 | Viertler | H03K 3/017 |

FOREIGN PATENT DOCUMENTS

| | | | | |
|---|---|---|---|---|
| DE | 102012215074 A1 * | 2/2014 | | H01M 2/348 |
| DE | 102017214302 A1 * | 2/2019 | | B60L 3/00 |
| JP | 2008-263776 A | 10/2008 | | |
| KR | 10-2014-0015252 A | 2/2014 | | |
| KR | 10-1489219 B1 | 2/2015 | | |
| KR | 10-2018-0048695 A | 5/2018 | | |
| KR | 10-2018-0058056 A | 5/2018 | | |
| KR | 10-2019-0018378 A | 2/2019 | | |

OTHER PUBLICATIONS

DE-102012215074-A1 English translation (Year: 2014).*
EPO Extended European Search Report dated Feb. 24, 2022, issued in corresponding European Patent Application No. 21196413.5 (9 pages).
Korean Notice of Allowance, with English translation, dated Nov. 23, 2022, issued in corresponding Korean Patent Application No. 10-2020-0122486 (4 pages).
Chinese Office Action, with English translation, dated May 18, 2023, issued in corresponding Chinese Patent Application No. 202111091190.9 (21 pages).
Chinese Office Action, with English translation, dated Oct. 25, 2023, issued in corresponding Chinese Patent Application No. 202111091190.9 (18 pages).

* cited by examiner

BATTERY PROTECTION APPARATUS AND BATTERY SYSTEM INCLUDING THE SAME

CROSS-REFERENCE TO RELATED APPLICATION

The present application claims priority to and benefits of Korean Patent Application No. 10-2020-0122486, filed in the Korean Intellectual Property Office on Sep. 22, 2020, the entire contents of which are incorporated herein by reference.

BACKGROUND

1. Field

Aspects of some embodiments of the present invention relate to a battery apparatus and a battery system including the same.

2. Description of the Related Art

A rechargeable or secondary battery differs from a primary battery in that, in a rechargeable or secondary battery, charging and discharging can be repeated, as opposed to the primary battery, which only provides non-reversible conversion from chemical energy to electrical energy. A low-capacity rechargeable battery may be used as a power supply device for small electronic devices such as portable telephones, laptops computers, and camcorders, and a high-capacity rechargeable battery is used as a power supply device for an energy storage system (ESS) or uninterruptible power supply (UPS) using medium or large batteries used for electric vehicles (EVs), hybrid vehicles (HVs), for home or industry system, etc.

The rechargeable battery may be utilized as a battery module including a plurality of unit battery cells connected in series and/or in parallel, thereby providing high energy density for running a motor or vehicle, e.g., a hybrid vehicle. That is, the battery module is formed by interconnecting electrode terminals of a plurality of unit battery cells according to an amount of power required to implement a high-power rechargeable battery for an electric vehicle, for example. One or more battery modules are mechanically and electrically integrated to form a battery system.

In the case of the battery module, when an operation abnormality such as an overcurrent flow occurs, a problem such as swelling of a unit battery cell and damage due to overheating may occur. Accordingly, it may be desirable to prevent damage to a unit cell from an overcurrent and protect a load by separating the load from the overcurrent by using a protection element such as a fuse.

However, when the fuse does not normally operate, there is a problem that the load cannot be safely protected from an overcurrent and an external short-circuit.

The above information disclosed in this Background section is only for enhancement of understanding of the background and therefore the information discussed in this Background section does not necessarily constitute prior art.

SUMMARY

Aspects of some embodiments according to the present invention may include a system and method to protect a battery module by operating a fuse with various signals.

Aspects of some embodiments according to the present disclosure may include a system and method to diagnose a fuse at a low cost to protect a battery.

Aspects of some embodiments may enable operating a fuse even in the event of an accident.

Aspects of some embodiments of the present invention include a battery protection apparatus including: a fuse element positioned on a current path between a battery module and an external load to block the current path; and an ignition switch configured to receive an operating voltage from the battery module or a capacitor charged by the battery module, to ignite the fuse element.

According to some embodiments, the ignition switch may generate a signal for igniting the fuse element depending on a control signal applied from a plurality of different external units.

According to some embodiments, the battery protection apparatus may be connected to a battery management system (BMS) and an electronic control unit (ECU) of a vehicle, and the ignition switch may receive a control signal from the BMS or the ECU.

According to some embodiments, the apparatus may further include: a first switch configured to receive an operating voltage from the battery module and to apply a diagnostic current to the fuse element; and an abnormality detection unit configured to measure a voltage applied to the fuse element when the diagnostic current flows through the fuse element, and the BMS may determine a failure of the ignition switch based on the voltage applied to the fuse element.

According to some embodiments, the apparatus may further include a second switch connected between the fuse element and a ground, the abnormality detection unit may measure a voltage of a signal that ignites the fuse element when the fuse element is not connected to the ground, and the BMS may determine a failure of the ignition switch based on the voltage of the signal that ignites the fuse element.

According to some embodiments, the second switch may be operated to connect the fuse element to the ground while the diagnosis current flows.

According to some embodiments, the second switch may receive an operating voltage from the capacitor.

According to some embodiments, the fuse element may be a pyro fuse positioned adjacent to the current path.

According to some embodiments of the present invention, a battery system includes: a battery module configured to include a plurality of battery cells; a battery protection apparatus; and a battery management system (BMS) configured to control the battery module and the battery protection apparatus, and the battery protection apparatus may receive an operating voltage from the battery module or a capacitor charged by the battery module.

According to some embodiments, the battery protection apparatus may include: a fuse element positioned on a current path between a battery module and an external load to block the current path; and an ignition switch configured to receive an operating voltage from the battery module or the capacitor, to ignite the fuse element.

According to some embodiments, the ignition switch may generate a signal for igniting the fuse element depending on a control signal applied from a plurality of different external units.

According to some embodiments, the battery system may be mounted on a vehicle, and the ignition switch may receive a control signal from the BMS or an electronic control unit (ECU) of the vehicle.

According to some embodiments, the battery protection apparatus may further include: a first switch configured to receive an operating voltage from battery module and to apply a diagnostic current to the fuse element; and an abnormality detection unit configured to measure a voltage applied to the fuse element when the diagnostic current flows through the fuse element, and the BMS may determine a failure of the ignition switch based on the voltage applied to the fuse element.

According to some embodiments, the battery protection apparatus may further include a second switch connected between the fuse element and a ground, the abnormality detection unit may measure a voltage of a signal that ignites the fuse element when the fuse element is not connected to the ground, and the BMS may determine a failure of the ignition switch based on the voltage of the signal that ignites the fuse element.

According to some embodiments, the second switch may be operated to connect the fuse element to the ground while the diagnosis current flows.

According to some embodiments, the second switch may receive an operating voltage from the capacitor.

According to some embodiments, the fuse element may be a pyro fuse positioned adjacent to the current path.

According to some embodiments, there is an effect that a safe battery module may be manufactured at a relatively low cost.

According to some embodiments, there is an effect that whether a fuse is abnormal may be easily checked or determined.

According to some embodiments, there is an effect that an additional accident caused by the battery may be prevented or reduced.

DETAILED DESCRIPTION

Aspects of some embodiments of the present invention will now be described in more detail with reference to the accompanying drawings. Hereinafter, an operation effect and a method of implementing the same according to some embodiments of the present invention will be described in more detail with reference to the accompanying drawings. In the drawings, the same reference numerals denote the same elements, and redundant explanations will be omitted. However, the present invention may be embodied in various forms, and should not be construed as being limited only to the embodiments shown herein. Rather, these embodiments are provided by way of example to make embodiments according to the present disclosure more thorough and more complete, and will fully convey aspects and features of embodiments according to the present invention to those skilled in the art.

Accordingly, processes, elements, and techniques deemed not necessary to those skilled in the art for complete understanding of aspects and features may not be described. In the drawings, the relative sizes of elements, layers, and regions may be exaggerated for clarity.

As used herein, the term "and/or" includes any and all combinations of one or more related listed items. The use of "can/may" in describing an example embodiment of the present invention indicates "at least one example embodiment of the present invention."

In the following description of example embodiments of the present invention, terms in the singular form may include plural forms unless the context clearly indicates otherwise.

It will be understood that the terms "first" and "second" are used to describe various elements, but these elements should not be limited by these terms. These terms are only used to distinguish one element from another. For example, a first constituent element may be referred to as a second constituent element, and the second constituent element may be referred to as the first constituent element without departing from the scope of the present invention. As used herein, the term "and/or" includes any and all combinations of one or more related listed items. An expression such as "at least one" precedes a list of elements, modifying the entire list of elements and not individual elements of the list.

As used in this specification, the terms "substantially", "approximately", and similar terms are used as approximate terms but are not used as degree terms, and they are not intended to illustrate inherent deviations of measured or calculated values evident to those skilled in the art. In addition, when the term "substantially" is used in combination with a characteristic that can be expressed using numerical values, the term "substantially" refers to including a range of +/−5% of the value.

Figure 1:
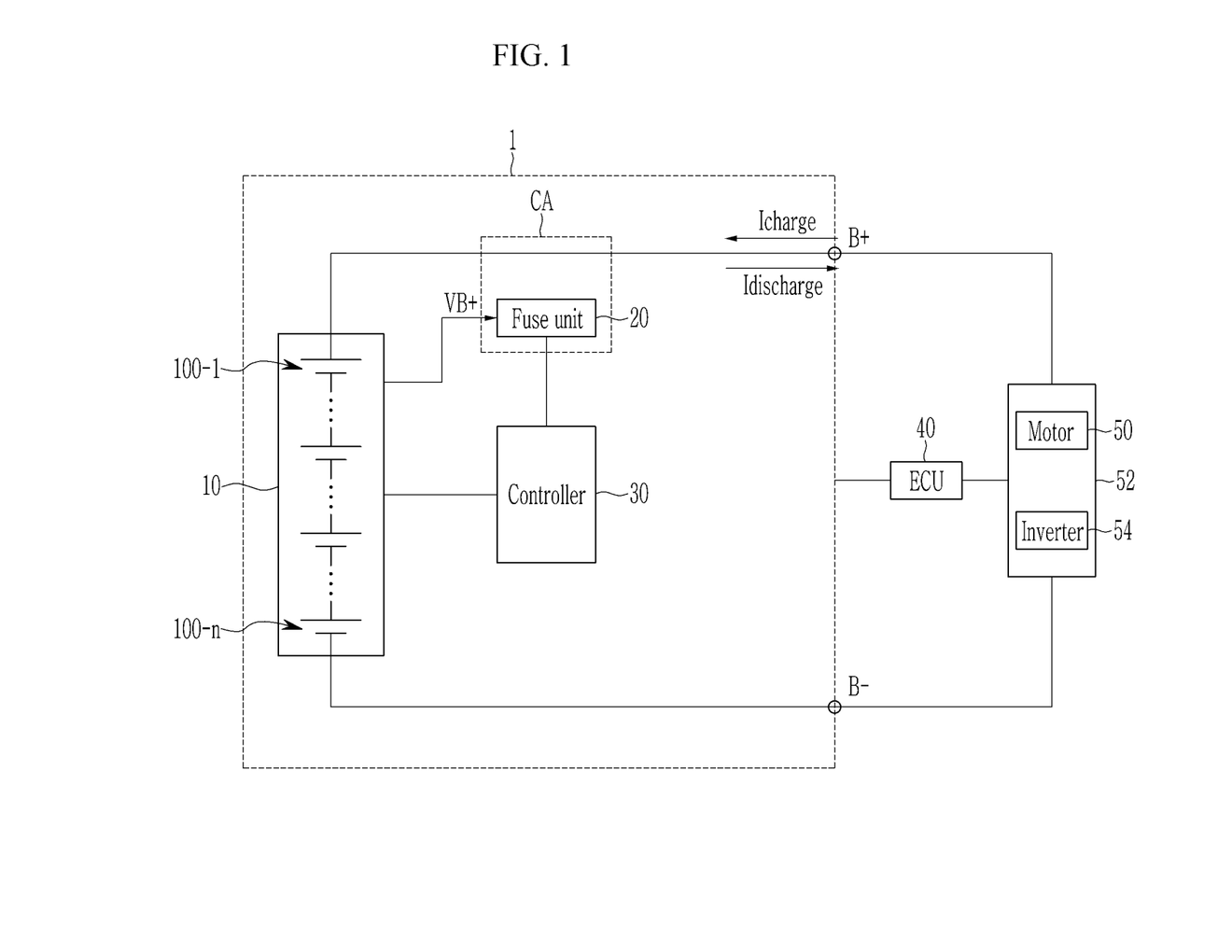
FIG. 1 illustrates a block diagram showing a vehicle including a battery system according to some embodiments.

FIG. 1 illustrates a block diagram showing a vehicle including a battery system according to some embodiments.

Although FIG. 1 illustrates an example in which the battery system according to some embodiments may be applied to a vehicle, the battery system may be applied to any technical field as long as a secondary battery can be applied, such as a home or industrial energy storage system (ESS) or an uninterruptible power supply (UPS) system, as well as the vehicle.

The vehicle may include a battery system 1, an electronic control unit (ECU) 40, and a load 52. In this case, the load 52 may include a motor 50 and an inverter 54.

The battery system 1 is an electric energy source that provides a driving force to the motor 50 to drive the vehicle. The battery system 1 includes a battery module 10, a battery protection apparatus 20, and a controller 30.

In the battery module 10, a plurality of unit battery cells 100-1, . . . , and 100-$n$ are connected in series and/or in parallel. Herein, a type of the battery module 10 is not particularly limited, and may include a lithium ion battery, a lithium polymer battery, a nickel cadmium battery, a nickel hydrogen battery, a nickel zinc battery, and the like.

In addition, the battery module 10 may be charged or discharged by the inverter 54 depending on driving of the motor 50 and/or an internal combustion engine. The battery module 10 may be charged or discharged by a charging current Icharge or a discharging current Idischarge flowing through a positive terminal B+.

The battery protection apparatus 20 for protecting the battery module 10 may be positioned on or along a charging/discharging path of the battery module 10, such that current flowing to/from the battery module 10 flows through the battery protection apparatus. The battery protection apparatus 20 may perform a protection operation on the battery module 10. The battery protection apparatus 20 may operate by receiving a battery voltage VB+ from the battery module 10.

The battery protection apparatus 20 may include a fuse that is directly connected to a charge/discharge wire, or a pyro switch positioned adjacent to the charge/discharge wire.

The pyro switch may explode in response to an operation signal from the controller 30 or the ECU 40 to disconnect the charge/discharge wire within an adjacent area CA of the pyro switch. Alternatively, the pyro switch may be connected between the unit battery cells 100-1, . . . , and 100-n in the battery module 10, to disconnect the connection wire between the unit battery cells 100-1, . . . , and 100-n.

For monitoring, control, and/or setting of the battery module 10, the battery protection apparatus 20, and the like, the battery system 1 includes a controller 30. As the controller 30, a battery management unit (BMU) and/or a battery management system (BMS) may be included.

The controller 30 estimates or identifies a state of the battery module 10 and manages the battery module 10 using estimated state information. For example, the controller 30 estimates and manages state information, such as a state of charge (SOC), a state of health (SOH), a maximum input/output power allowance, an output voltage, etc., of the battery module 10. In addition, the controller 30 may control charging or discharging of the battery module 10 by using such state information, and may further estimate a replacement time of the battery module 10. This controller may be an integral part of the battery system, and may be located in a common housing or may be a part of a remote control unit that communicates with the battery system via an appropriate communication bus. The controller 30 is generally connected to each battery module of the battery system as well as a controller of one or more electricity consumers.

The controller 30 is connected to the battery protection apparatus 20. The controller 30 may receive a signal related to fuse diagnosis from the battery protection apparatus 20 to diagnose a fuse, a pyro switch, and the like. In addition, the controller 30 may operate the battery protection apparatus 20 depending on a state of the battery module 10.

The ECU 40 controls a vehicle. For example, the ECU 40 determines a torque degree based on information such as an accelerator, a brake, and a speed, and controls an output of the motor 50 to match torque information.

In addition, the ECU 40 sends a control signal to the inverter 54 such that the battery module 10 can be charged or discharged by the controller 30.

The motor 50 drives the vehicle based on control information (e.g., torque information) transferred from the ECU 40 using electric energy of the battery module 10.

The inverter 54 causes the battery module 10 to be charged or discharged based on the control signal of the ECU 40.

Next, the battery protection apparatus 20 will be described in more detail with reference to FIG. 2.

Figure 2:
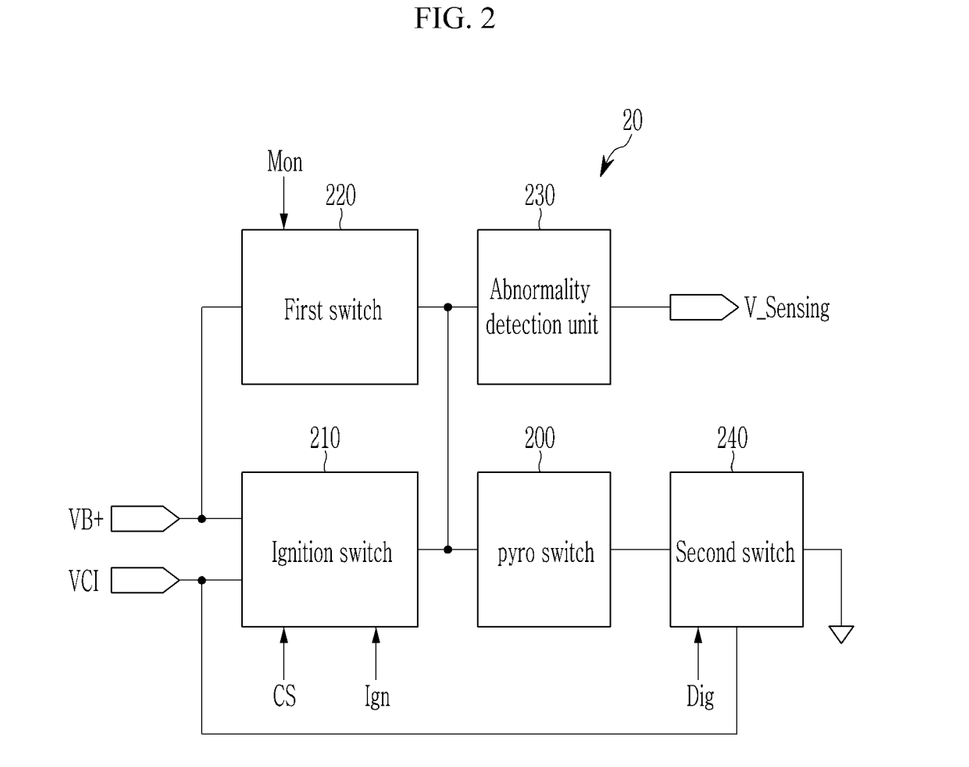
FIG. 2 schematically illustrates a battery protection apparatus according to some embodiments.

FIG. 2 schematically illustrates a battery protection apparatus according to some embodiments.

As illustrated in FIG. 2, the battery protection apparatus 20 includes a pyro fuse 200 and an ignition switch 210 that ignites the pyro fuse 200, a first switch 220, an abnormality detection unit (or abnormality detector) 230, and a second switch 240.

The pyro fuse 200 cuts a wire by an explosion such as a spark charge provided therein by an ignition signal from the ignition switch 210.

The ignition switch 210 may receive voltages VB+ and VC1 for operation, and may generate the ignition signal for igniting the ignition switch 210 by operation signals CS and Ign from the outside. The operation signal CS may be applied from the controller 30, and the operation signal Ign may be applied from the ECU 40.

The first switch 220 may receive the voltage VB+ for operation, and may supply a diagnostic current I_Ign to check whether the pyro fuse 200 normally operates. Upon receiving a monitoring signal Mon from the controller 30, the first switch 220 causes the diagnosis current I_Ign that is substantially constant to flow to the pyro fuse 200.

When the diagnostic current I_Ign flows through the pyro fuse 200, the abnormality detection unit 230 may amplify a node voltage V_Ign to output it as a diagnostic signal V_Sensing. The diagnostic signal V_Sensing may be outputted to the controller 30. When resistance of the pyro fuse 200 through which the diagnostic current I_Ign of a certain magnitude flows is changed, the node voltage V_Ign is changed, so that the controller 30 can diagnose whether or not the pyro fuse 200 is abnormal.

The abnormality detection unit 230 may supply the diagnostic current I_Ign at a specific cycle (e.g., 33 Hz (10 ms ON duty/20 ms OFF duty)) to check internal resistance of the pyro fuse 200.

In addition, as described below, the abnormality detection unit 230 may check whether the ignition switch 210 is abnormal by operating together with the second switch 240.

The second switch 240 may operate to check whether the ignition switch 210 is abnormal. For example, the second switch 240 may be turned off by the diagnostic signal Dig in order to check whether the ignition switch 210 is abnormal. In this case, the pyro fuse 200 is in a floating state, no current flows, and a value of the node voltage V_Ign is changed by the operation of the ignition switch 210. When a failure occurs in the ignition switch 210, the value of the node voltage V_Ign does not change or a changed voltage value is very small, so that the failure of the ignition switch 210 may be determined through the diagnostic signal V_Sensing.

In addition, the second switch 240 may operate by receiving the voltage VC1 from the capacitor C1, and may operate even when the battery voltage VB+ is not applied to the battery protection apparatus 20. During a period other than a period for diagnosing the ignition switch 210, the second switch 240 may maintain a turned-on state.

Next, an internal circuit of the battery protection apparatus 20 and an operation thereof will be described in more detail with reference to FIG. 3 to FIG. 10.

Figure 3:
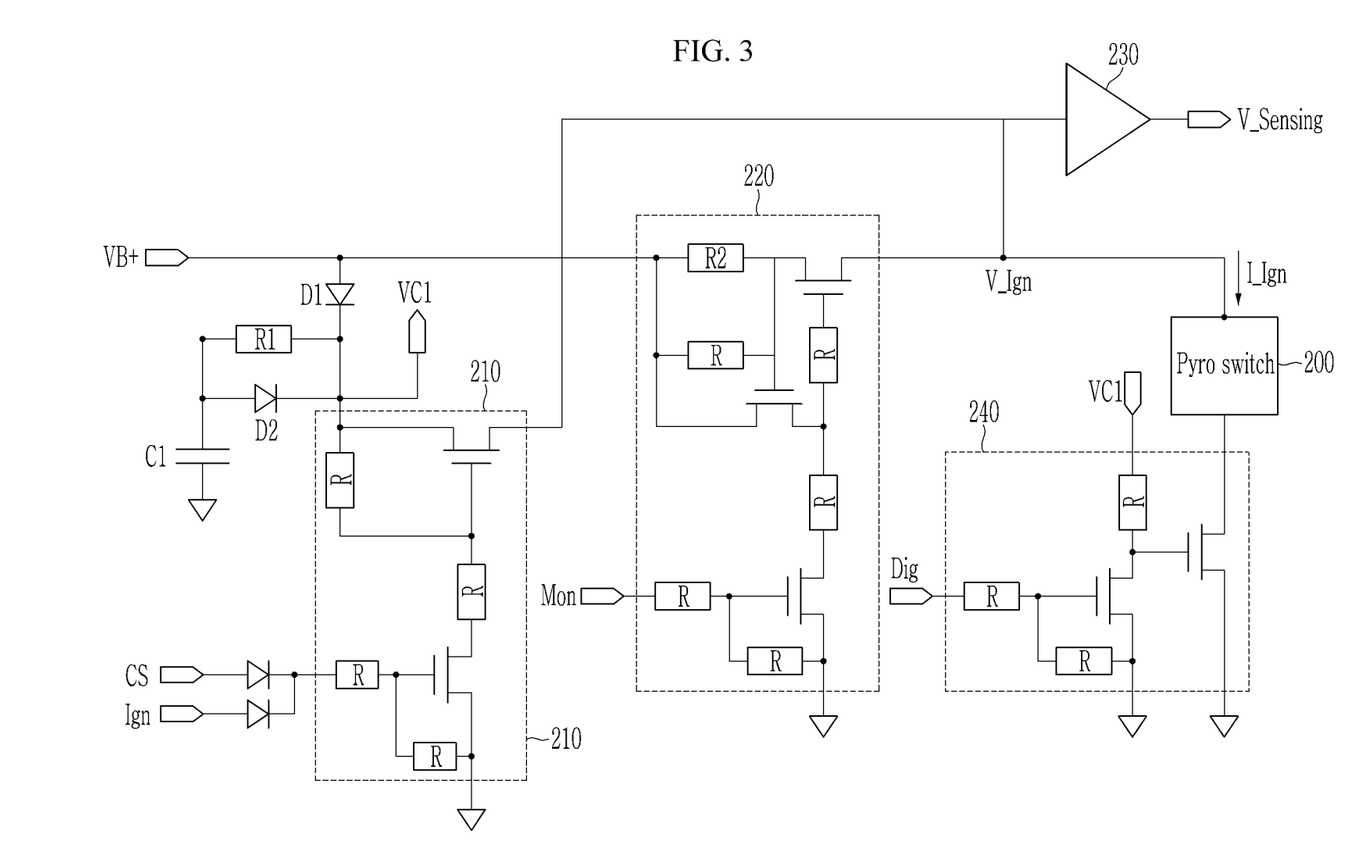
FIG. 3 illustrates a circuit diagram showing the battery protection apparatus of FIG. 2.

FIG. 3 illustrates a circuit diagram showing the battery protection apparatus of FIG. 2.

As illustrated in FIG. 3, the ignition switch 210 may receive the battery voltage VB+ through a diode D1 or may receive a voltage of a capacitor C1 charged by the battery voltage VB+. When an accident occurs, the capacitor C1 transfers a voltage through a diode D2. A charging operation of the capacitor C1 will now be described with reference to FIG. 4.

Figure 4:
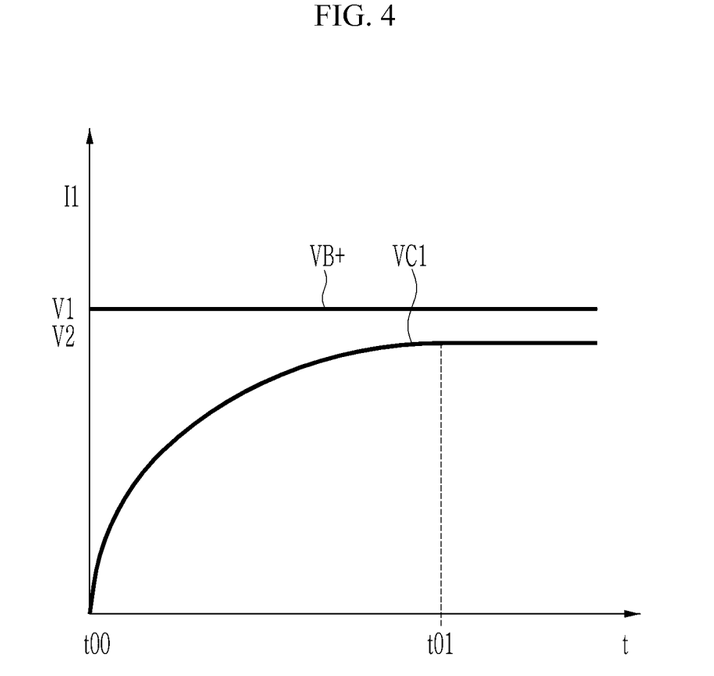
FIG. 4 illustrates a graph showing a voltage charged in a capacitor of a battery protection apparatus according to some embodiments.

FIG. 4 illustrates a graph showing a voltage charged in a capacitor of a battery protection apparatus according to some embodiments.

The capacitor C1 is charged through a resistor R1 to prevent or reduce instances of an inrush current during periods t00 to t01. For example, when the battery voltage VB+ is a voltage V1, a voltage charged in the capacitor C1 may be a voltage V2.

The ignition switch 210 may be turned on by an enable level operation signal CS or Ign to increase a node voltage V_ign. An ignition operation of the ignition switch 210 will be described with reference to FIG. 5 and FIG. 6.

Figure 5:
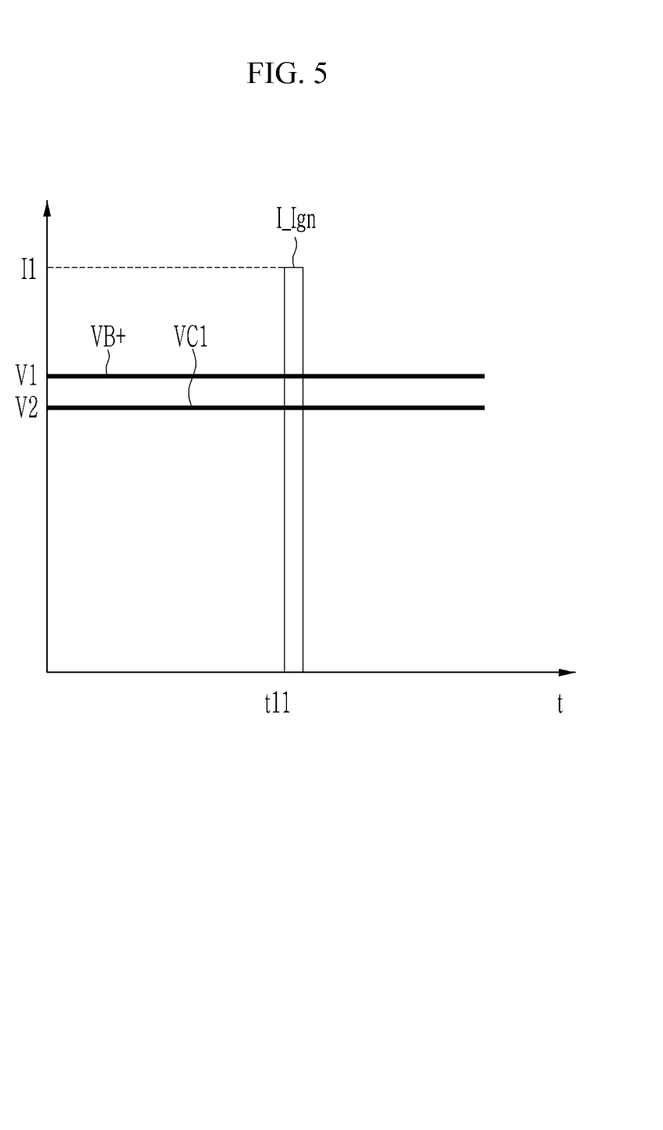
FIG. 5 illustrates a graph showing a signal when a battery protection apparatus operates with battery power according to some embodiments.
Figure 6:
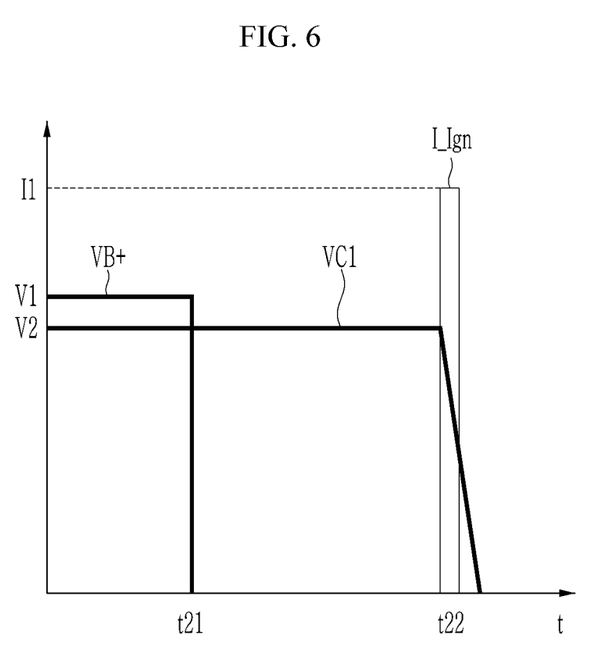
FIG. 6 illustrates a graph showing a signal when a battery protection apparatus operates with its own power according to some embodiments.

FIG. 5 illustrates a graph showing a signal when a battery protection apparatus operates with battery power according to some embodiments, and FIG. 6 illustrates a graph showing a signal when a battery protection apparatus operates with its own power according to some embodiments.

As illustrated in FIG. 5, when an operation signal Ign is applied to the ignition switch 210 at a time point t11, a high current I_Ign flows through the pyro fuse 200 to ignite the pyro fuse 200.

As illustrated in FIG. 6, the battery voltage VB+ is not supplied to the ignition switch 210 from a time point t21. In this case, the ignition switch is operated by backup power stored in the capacitor C1. When an operation signal Ign is applied to the ignition switch 210 at a time point t21, a high current I_Ign flows through the pyro fuse 200 to ignite the pyro fuse 200.

That is, even when an operating voltage is not supplied from the battery module 10, the battery protection apparatus 20 according to some embodiments may operate the pyro fuse 200 to protect the battery module 10, the battery system 1, and a vehicle including the same.

Next, the first switch 220 receives the monitoring signal Mon of an enable level, is turned on, and applies a current I_Ign (e.g., of a set or a predetermined magnitude) to the pyro fuse 200. Then, the node voltage V_Ign that depends on a resistance value of the pyro fuse 200 is applied to the abnormality detection unit 230. In this case, a magnitude of the current I_Ign may be set by designing it by changing a value of the resistor R2.

An operation of the first switch 220 will now be described with reference to FIG. 7, FIG. 8, FIG. 9, and FIG. 10.

FIG. 7, FIG. 8, FIG. 9, and FIG. 10 illustrate graphs showing signals during diagnosis of a battery protection apparatus according to some embodiments.
Although it is illustrated that a time, a current, and the like are changed depending on a time in FIG. 7, FIG. 8, FIG. 9, and FIG. 10, it should be noted that this is illustrated for an experiment when the battery voltage VB+ is within a voltage range (e.g., a set or predetermined voltage range), and the battery voltage VB+ itself does not change in a cycle (e.g., a set or predetermined cycle). That is, even when the battery voltage (VB+) is changed in the drawings, because the signal from the abnormality detection unit 230 shows a constant value, a person skilled in the art can know reliability of the battery protection apparatus 20 according to some embodiments.

Figure 7:
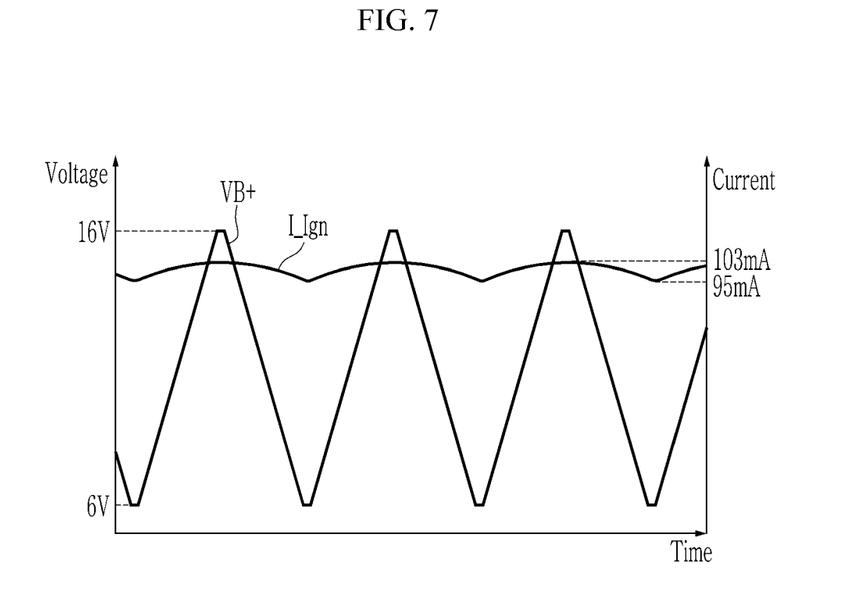
FIG. 7, FIG. 8, FIG. 9, and FIG. 10 illustrate graphs showing signals during diagnosis of a battery protection apparatus according to some embodiments.

As illustrated in FIG. 7, when the battery voltage VB+ is supplied as 6 V to 16 V, the current I_Ign flowing through the pyro fuse 200 by the first switch 220 may be 95 mA to 103 mA.

Figure 8:
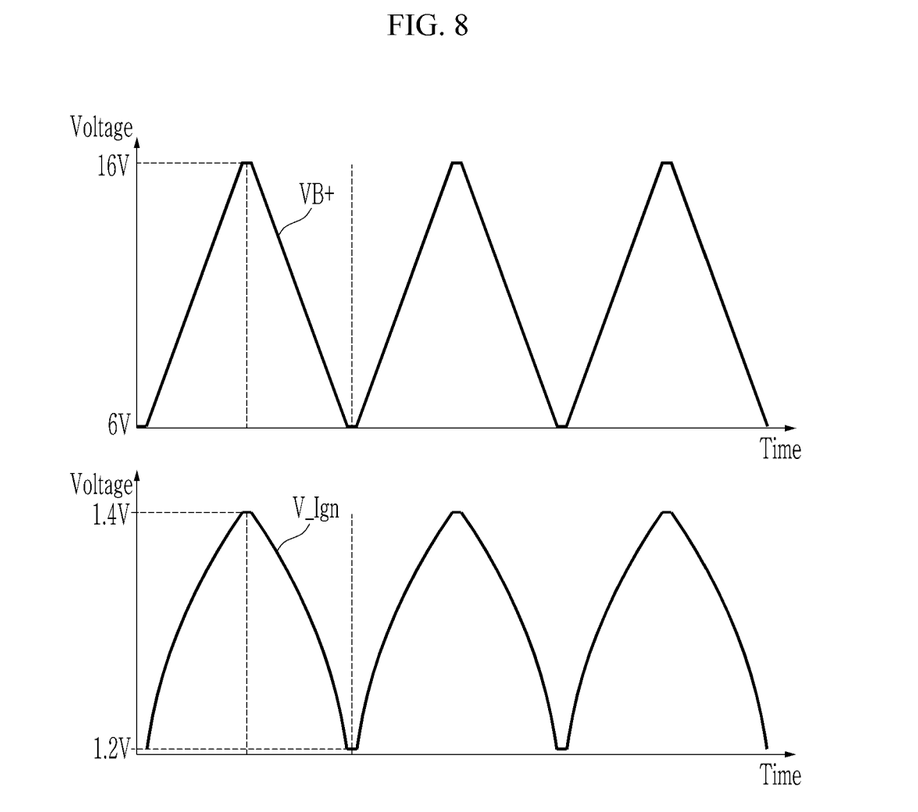
Figure 9:
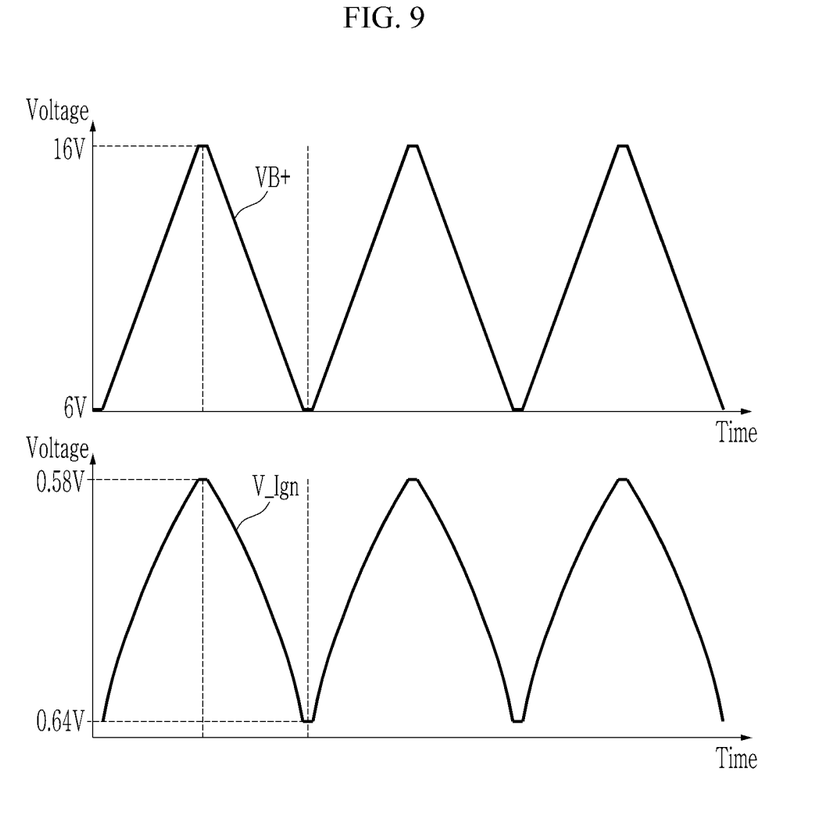
Figure 10:
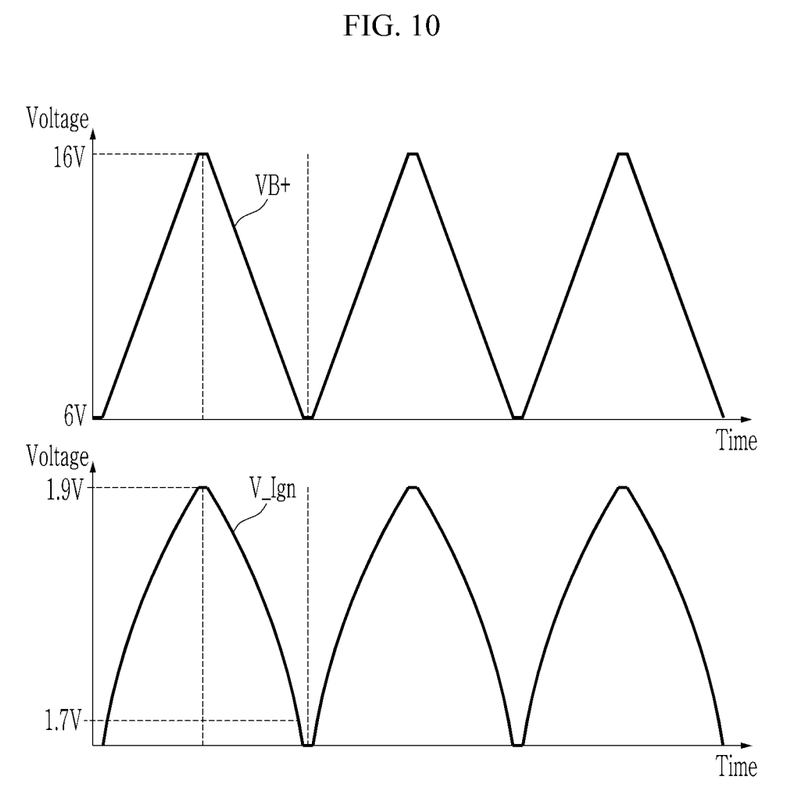

FIG. 8 shows a case where an internal resistance value of the pyro fuse 200 is 2.1Ω, FIG. 9 shows a case where the internal resistance value of the pyro fuse 200 is 1Ω, and FIG. 10 shows a case where the internal resistance value of the pyro fuse 200 is 3Ω.

In FIG. 8, when the battery voltage VB+ is supplied as 6 V to 16 V, the node voltage V_Ign may be 1.2 V to 1.4 V. In FIG. 9, when the battery voltage VB+ is supplied as 6 V to 16 V, the node voltage V_Ign may be 0.58 V to 0.64 V. In FIG. 10, when the battery voltage VB+ is supplied as 6 V to 16 V, the node voltage V_Ign may be 1.7 V to 1.9 V.

That is, the battery protection apparatus 20 according to some embodiments may detect a change in the internal resistance value of the pyro fuse 200 by amplifying the node voltage V_Ign as the diagnostic signal V_Sensing and outputting it.

In the case of a vehicle accident, personal injury may be caused, so in the case of a battery system mounted on a vehicle, a pyro fuse is mounted to prevent malfunction caused by a battery module. Power of an ignition switch for operation of a pyro fuse is applied from a battery, but there is a problem that power from the battery may not be applied during the vehicle accident.

The battery protection apparatus and the battery system including the same according to some embodiments may include backup power in addition to the power transmitted from the battery, thereby ensuring the operation of the pyro fuse even in a vehicle accident.

The battery protection apparatus and the battery system including the same according to some embodiments may use a passive element with a leakage current of several nA to several uA, so that the second switch that always operates on capacitor power rather than battery power also includes an FET that does not use a current, and thus even when power is not supplied from the battery after the vehicle accident, the current of the capacitor is hardly consumed, so that the operation of the pyro fuse may be guaranteed even in a vehicle accident.

The battery protection apparatus and the battery system including the same according to some embodiments may include hardware to perform abnormal diagnosis of a pyro fuse and abnormality diagnosis of an ignition switch.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A battery protection apparatus comprising:
a fuse element on a current path between a battery module and an external load to block the current path between the battery module and the external load;
a first switch connected to a node between the fuse element and the first switch, and configured to provide a diagnostic current to flow through the fuse element based on a voltage of the battery module; and
an ignition switch connected to the node, and configured to receive an operating voltage from the battery module or a capacitor charged by the battery module, to ignite the fuse element by increasing a voltage of the node,
wherein, when the operating voltage from the battery module stops, the ignition switch is configured to ignite the fuse element according to the operating voltage charged in the capacitor by the battery module.

2. The battery protection apparatus of claim 1, wherein the ignition switch is configured to generate a signal for igniting the fuse element according to a control signal applied from a plurality of different external units.

3. The battery protection apparatus of claim 2, wherein
the battery protection apparatus is connected to a battery management system (BMS) and an electronic control unit (ECU) of a vehicle, and
the ignition switch is configured to receive the control signal from the BMS or the ECU.

4. The battery protection apparatus of claim 3, further comprising:
the first switch configured to receive the voltage from the battery module and to apply the diagnostic current to the fuse element; and
an abnormality detector configured to measure a voltage applied to the fuse element at the node in response to the diagnostic current flowing through the fuse element,
wherein the BMS is configured to determine a failure of the fuse element based on the voltage applied to the fuse element.

5. The battery protection apparatus of claim 4, further comprising
a second switch connected between the fuse element and a ground,
wherein the abnormality detector is configured to measure a voltage of a signal that ignites the fuse element in response to the fuse element not being connected to the ground, and
the BMS is configured to determine a failure of the ignition switch based on the voltage of the signal that ignites the fuse element.

6. The battery protection apparatus of claim 5, wherein
the second switch is configured to operate to connect the fuse element and the ground while the diagnostic current flows.

7. The battery protection apparatus of claim 5, wherein
the second switch is configured to receive an operating voltage from the capacitor.

8. The battery protection apparatus of claim 1, wherein
the fuse element comprises a pyro fuse.

9. A battery system comprising:
a battery module configured to include a plurality of battery cells;
a battery protection apparatus; and
a battery management system (BMS) configured to control the battery module and the battery protection apparatus,
wherein the battery protection apparatus is configured to receive an operating voltage from the battery module or a capacitor charged by the battery module,
wherein, when the operating voltage from the battery module stops, the battery protection apparatus is configured to operate according to the operating voltage charged in the capacitor by the battery module, and
wherein the battery protection apparatus comprises:
a first switch connected to a node between the first switch and a fuse element, and configured to provide a diagnostic current to flow through the fuse element based on a voltage of the battery module; and
an ignition switch connected to the node, and configured to receive the operating voltage from the battery module or the capacitor charged by the battery module, to ignite the fuse element by increasing a voltage of the node.

10. The battery system of claim 9, wherein
the battery protection apparatus includes:
the fuse element on a current path between the battery module and an external load to block the current path.

11. The battery system of claim 10, wherein
the ignition switch is configured to generate a signal for igniting the fuse element according to a control signal applied from a plurality of different external units.

12. The battery system of claim 11, wherein
the battery system is mounted on a vehicle, and
the ignition switch is configured to receive the control signal from the BMS or an electronic control unit (ECU) of the vehicle.

13. The battery system of claim 12, wherein
the battery protection apparatus includes:
the first switch configured to receive the voltage from the battery module and to apply the diagnostic current to the fuse element; and
an abnormality detector configured to measure a voltage applied to the fuse element in response to the diagnostic current flowing through the fuse element,
wherein the BMS is configured to determine a failure of the ignition switch based on the voltage applied to the fuse element.

14. The battery system of claim 13, wherein
the battery protection apparatus includes:
a second switch connected between the fuse element and a ground,
wherein the abnormality detector is configured to measure a voltage of a signal that ignites the fuse element in response to the fuse element not being connected to the ground, and
the BMS is configured to identify a failure of the ignition switch based on the voltage of the signal that ignites the fuse element.

15. The battery system of claim 14, wherein
the second switch is configured to operate to connect the fuse element and the ground while the diagnostic current flows.

16. The battery system of claim 14, wherein
the second switch is configured to receive an operating voltage from the capacitor.

17. The battery system of claim 10, wherein
the fuse element is a pyro fuse.

* * * * *